(12) United States Patent
Aizawa

(10) Patent No.: US 6,881,676 B2
(45) Date of Patent: Apr. 19, 2005

(54) SEMICONDUCTOR DEVICE MANUFACTURING METHOD

(75) Inventor: Osamu Aizawa, Miyagi (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 307 days.

(21) Appl. No.: 10/285,543

(22) Filed: Nov. 1, 2002

(65) Prior Publication Data

US 2003/0166341 A1 Sep. 4, 2003

(30) Foreign Application Priority Data

Mar. 1, 2002 (JP) ........................................ 2002/055399

(51) Int. Cl.[7] ............................................ H01L 21/311
(52) U.S. Cl. ........................ 438/700; 738/723; 738/725
(58) Field of Search ................................ 438/700, 702, 438/706, 719, 720, 723, 724, 725

(56) References Cited

U.S. PATENT DOCUMENTS 5,997,757 A * 12/1999 Nagayama et al. ........... 216/38
6,242,332 B1 * 6/2001 Cho et al. .................... 438/587
6,245,621 B1 * 6/2001 Hirohama .................... 438/303
6,465,310 B1 * 10/2002 Lee et al. .................... 438/299

* cited by examiner

Primary Examiner—Kin-Chan Chen
(74) Attorney, Agent, or Firm—Volentine Francos & Whitt P.L.L.C.

(57) ABSTRACT

A method for manufacturing a semiconductor device includes forming a plurality of gate electrodes on a semiconductor substrate, forming an etching prevention film over the surface of the adjacent gate electrodes and on the semiconductor substrate between the adjacent gate electrodes, and forming an organic insulation film having heat-resistance on the etching prevention film. The method further includes removing the organic insulation film above the gate electrodes in such a manner that the organic insulation film remains between the gate electrodes, forming an interlayer insulation film on a laminate section obtained by the organic insulation film removing step, forming a contact hole by removing the interlayer insulation film on the remaining organic insulation film with a width wider than the distance between the gate electrodes, and exposing the semiconductor substrate between the gate electrodes by removing the organic insulation film and the etching prevention film remaining inside the contact hole.

5 Claims, 4 Drawing Sheets

SEMICONDUCTOR DEVICE MANUFACTURING METHOD

BACKGROUND OF THE INVENTION

The present invention relates to a method for manufacturing semiconductor devices, and in particular to a method for manufacturing semiconductor devices characterized by steps for forming a contact hole.

One method for increasing the level of integration of semiconductor devices having a multi-layer wiring structure is a technology referred to as self-align contact (hereinafter referred to as SAC) technology.

SAC technology is mainly used for forming self-aligning contact holes such as, for example, contact holes for a DRAM bit line contact. An example of a method for forming a contact hole using SAC technology will be briefly described in the following.

First, a nitride film pattern (for example, a silicon nitride film) is formed ranging from the surface of gate electrode patterns formed adjacently on the upper part of a substrate, to the surface of the substrate between the electrodes.

This nitride film pattern will later function as an etching prevention film highly resistant to an etching method at the time of forming a contact hole using the SAC technology.

Next, an interlayer insulation film and resist patterns for forming a hole are sequentially formed on a sample having this nitride film.

Etching for forming a contact hole using the SAC technology is then carried out under highly selective conditions between the interlayer insulation film and the nitride film. At this time, the nitride film is made to function as an etching prevention film.

As a result, the etching process can be selectively stopped by the nitride film, and a specified contact hole can be therefore formed.

In this way, the diameter of an opening of the contact hole formed by this etching is determined by gate electrode patterns in a self-aligned manner. As a result, the contact hole can be formed in an easily controllable manner and the level of integration for semiconductor devices can be increased.

However, various problems such as the following examples arise at the time of forming a contact hole using the above-mentioned SAC technology.

(1) In order to prevent a gate electrode from being etched or exposed, an etching selectivity ratio of the nitride film covering the gate electrode to the interlayer insulation film is satisfactorily high at a flat section. However, the etching selectivity ratio at a grooved section defined by the crossing of an upper surface and a side surface of the gate electrodes formed below the contact hole is decreased to approximately ⅓ of that of the flat section.

(2) When the shape of the gate electrode patterns is uneven, the thickness of the nitride film formed on the gate electrode may also become uneven.

In this manner, in case of (1) or (2), the nitride film is undesirably etched and the shoulder section of the gate electrode may be exposed. As a result, wiring metal is embedded in the contact hole where the gate electrode is exposed, and a short-circuit failure therefore occurs at the gate electrode.

(3) Dry etching, etc. over an interlayer insulation film with a high aspect ratio may be carried out under the condition where a selectivity ratio of a nitride film to an interlayer insulation film is large.

In case (3), a reaction product generated by etching remains inside the contact hole to block the etching process.

Because these various problems will be more noticeable as the level of integration for semiconductor devices increases, a method capable of applying SAC technology is desired even when space between adjacent gate electrodes is limited.

SUMMARY OF THE INVENTION

A method for manufacturing a semiconductor device of the present invention includes forming a plurality of gate electrodes on a semiconductor substrate, forming an etching prevention film over the surface of the adjacent gate electrodes and on the semiconductor substrate between the adjacent gate electrodes, and forming an organic insulation film having heat-resistance on the etching prevention film. The method further includes removing the organic insulation film above the gate electrodes in such a manner that the organic insulation film remains between the gate electrodes, forming an interlayer insulation film on a laminate section obtained by the organic insulation film removing step, forming a contact hole by removing the interlayer insulation film on the remaining organic insulation film with a width wider than the distance between the gate electrodes, and exposing the semiconductor substrate between the gate electrodes by removing the organic insulation film and the etching prevention film remaining inside the contact hole.

DETAILED DESCRIPTION OF THE PREFERRED EMBODIMENTS

Figure 1:
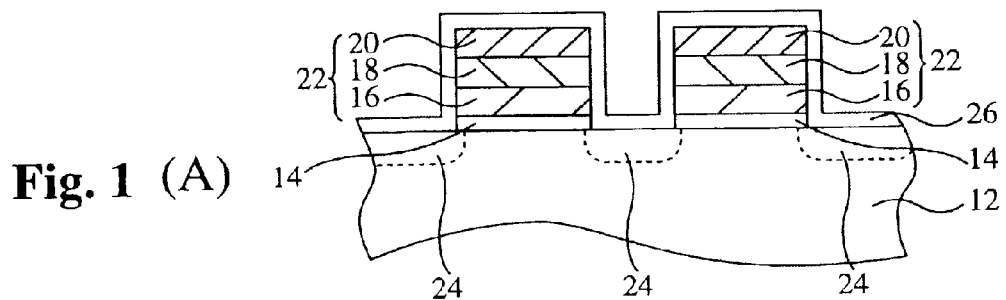
FIGS. 1(A)–1(C) are cross-sectional views used for describing steps for manufacturing a semiconductor device of the first embodiment of the present invention.
Figure 1:
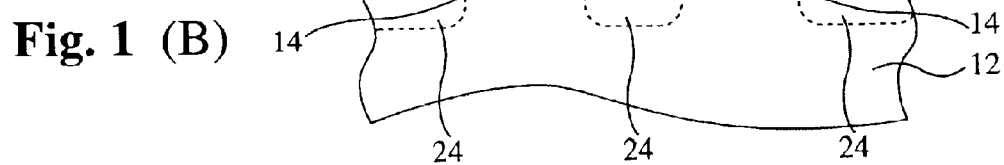
Figure 1:
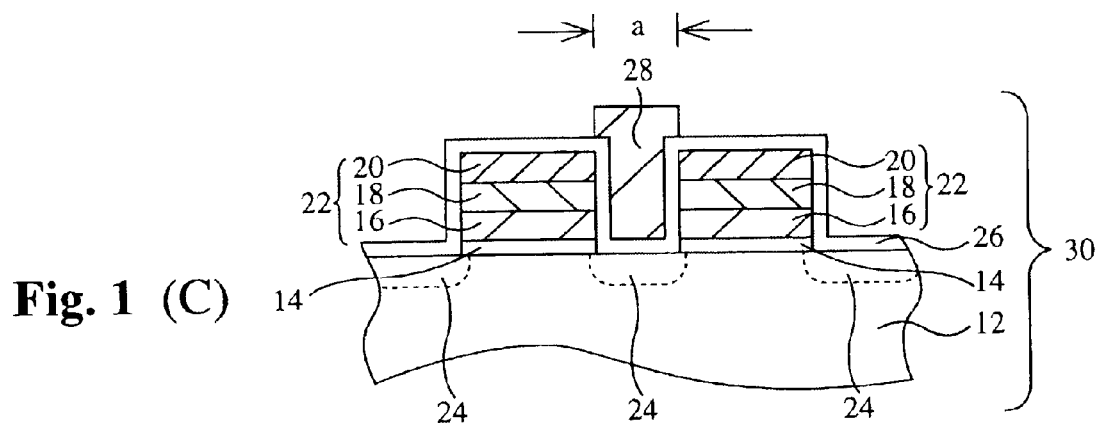
Figure 2:
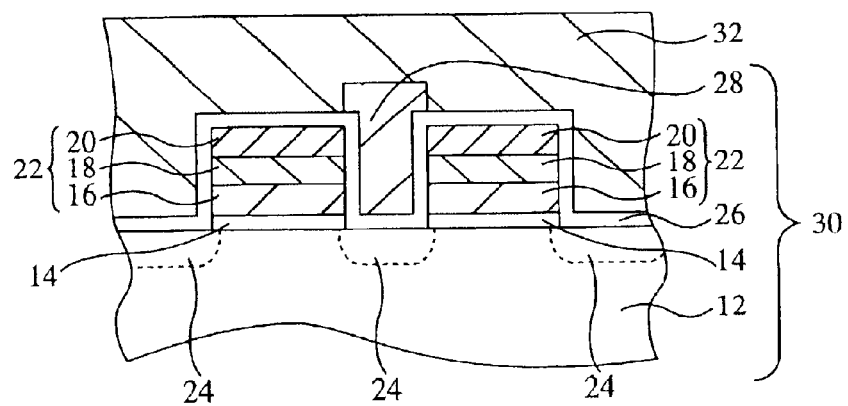
FIGS. 2(A)–2(C) are cross-sectional views used for describing steps for manufacturing a semiconductor device of the first embodiment of the present invention.
Figure 2:
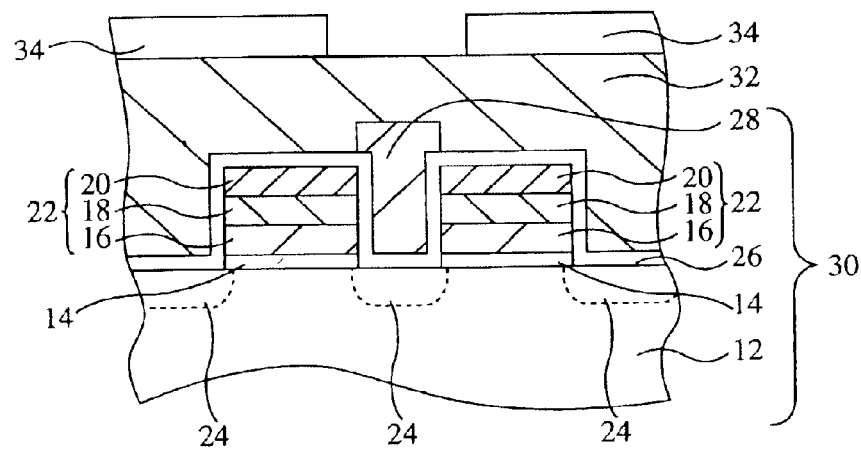
Figure 2:
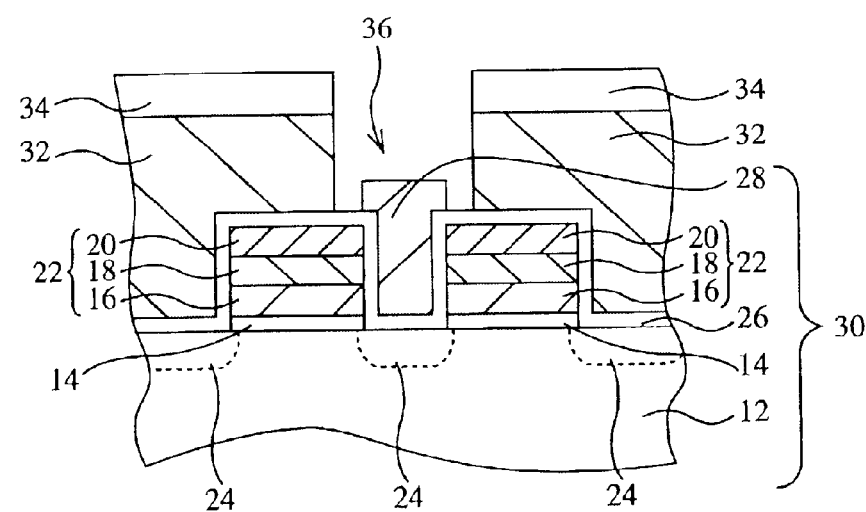
Figure 3:
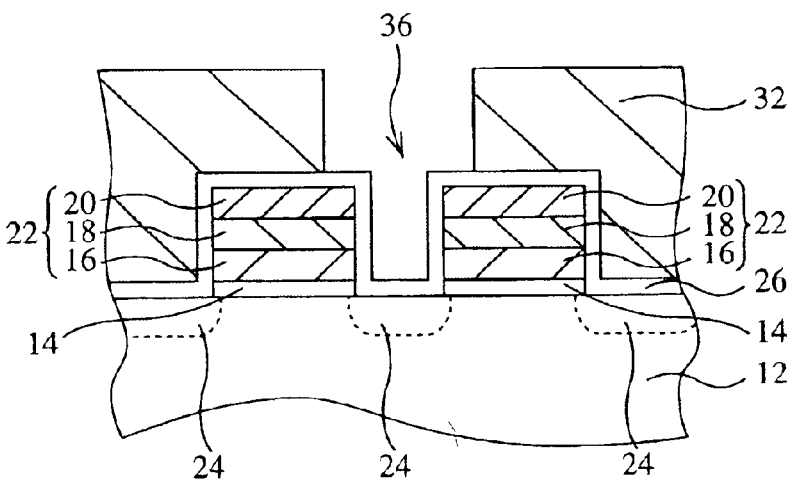
FIGS. 3(A) and 3(B) are cross-sectional views used for describing steps for manufacturing a semiconductor device of the first embodiment of the present invention.
Figure 3:
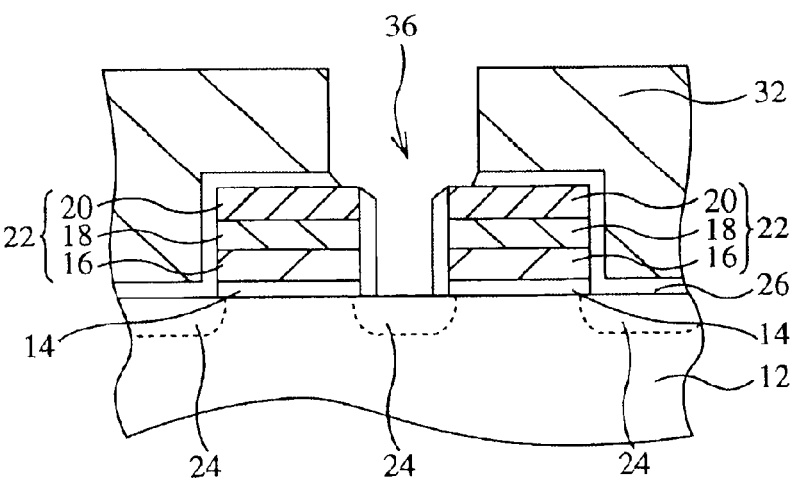
Figure 4:
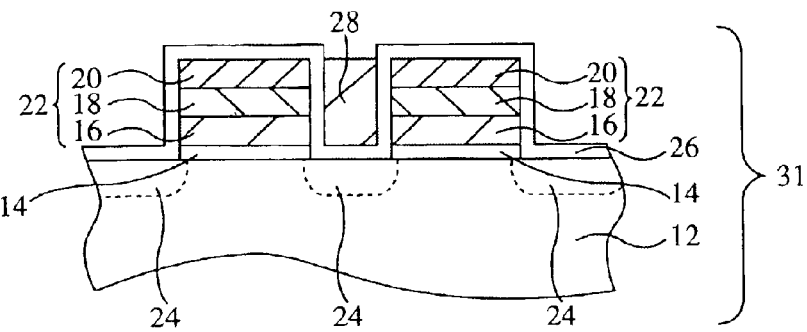
FIGS. 4(A)–4(C) are cross-sectional views used for describing steps for manufacturing a semiconductor device of the second embodiment of the present invention.
Figure 4:
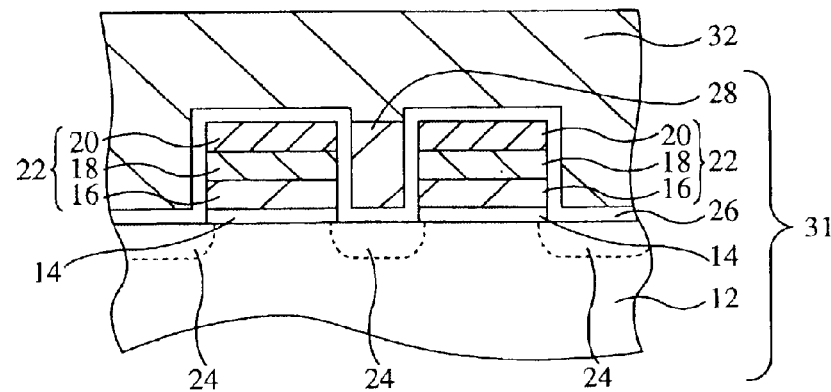
Figure 4:
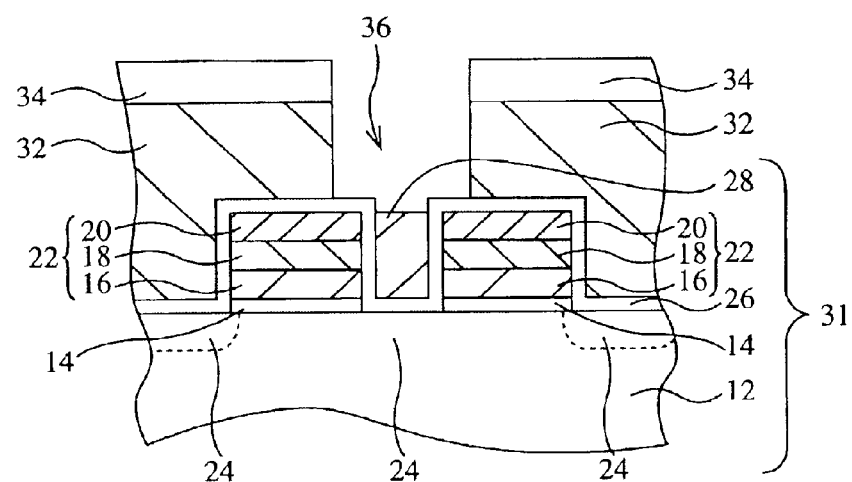

Preferred embodiments of the present invention will be described in the following based on FIG. 1(A) to FIG. 4(C). Each of FIG. 1(A) to FIG. 4(C) are process views showing in cross-section example configurations for methods for manufacturing semiconductor devices of the present invention. Individual drawings merely schematically illustrate shape, size, and location relationship of each structural component so as to understand the present invention, and the present invention is by no means limited to illustrated examples. In addition, in order to make drawings easily understood, a hatching (oblique line) showing a cross section is omitted except for a certain section. Although certain materials and conditions may be used in the following description, these materials and conditions are merely parts of preferred embodiments and the present invention is by no means limited to these. In each drawing, the same structural components are given the same numerals for illustration and repeated description thereof is therefore omitted.

First Embodiment

A method for manufacturing semiconductor devices of the present invention will be described in the following based on FIG. 1(A) to FIG. 3(B).

Here, description will be given using an example of a main part of MOS transistor unit that comprises the DRAM.

According to the first embodiment, first, as a gate electrode forming step, a plurality of gate electrodes are formed on a semiconductor substrate. A description will be given of the gate electrode forming step in the following.

Specifically, as shown in FIG. 1(A), first, a gate insulation film 14 of a thickness of 80 nm is formed in the gate electrode forming region on a silicon substrate 12 using a thermal oxidation method.

After sequentially forming, for example, a polysilicon film 16, a tungsten (W) film 18, and a silicon oxidation film 20 to a thickness of 100 nm, 100 nm, and 250 nm respectively using a CVD method as a gate electrode metal film (not shown), this gate electrode metal film is patterned in the shape of a gate electrode 22 on the silicon substrate 12 where the gate insulation film 14 is formed.

Further, ion injection is carried out using an arbitrary suitable method to form an impurity diffusion region (a source or drain region) 24 on this sample.

Next, as an etching prevention film forming step, an etching prevention film is formed over the surface of adjacent gate electrodes 22 and on the semiconductor substrate between the adjacent gate electrodes 22.

Specifically, a silicon nitride film (for example, Si3N4) 26 constituting an etching prevention film is formed to a thickness of 40 nm on a region of this silicon substrate 12 corresponding to a region where at least a contact hole is planned to be formed during a subsequent step (a contact hole forming region), using a CVD method.

Next, as an organic insulation film forming step, an organic insulation film with heat resistance is formed on the etching prevention film 26.

Specifically, a heat-resistant organic insulation film, for example, a polyimide (resin) film 28 is formed on the whole surface of the silicon substrate 12 as shown in FIG. 1(A) using a spin coating method in a manner so that the polyimide film 28 is embedded in a section where gate electrodes 22 are sandwiched (FIG. 1(B)).

In this way, a heat-resistant polymer material such as a polyimide can be used as an organic insulation film material. The organic insulation film material is not limited to one kind of heat-resistant polymer material, and a plurality of kinds of heat-resistant polymer materials may be mixed for usage. In addition, additives may be added to a heat-resistant polymer material for use depending on the purpose.

Next, as an organic insulation film removing step, the organic insulation film located above the gate electrodes 22 is removed in such a manner that the organic insulation film 28 remains between the gate electrodes 22.

Specifically, by utilizing photosensitivity of the polyimide film 28, patterning of the polyimide film 28 is carried out using a photolithography method.

Namely, an exposure step and a development step are carried out on the upper part of the polyimide film 28 shown in FIG. 1(B) in such a manner that the polyimide film 28 contiguously remains between the gate electrodes 22 and on a section of each gate electrode 22. A laminate section 30 obtained in this manner is shown in FIG. 1(C). As shown in FIG. 1(C), a groove section of the gate electrodes 22 is covered with the polyimide film 28.

At this time, a width a of the polyimide film 22 in a crossing direction of adjacent gate electrodes 22 (FIG. 1(C)) can be arbitrarily set according to photolithographical precision. However, it is preferable to set the width a to be smaller than the diameter of a opening of a contact hole 36 formed during the following step. By doing so, when the contact hole 36 is opened during the following step, the number of steps can be suppressed because a step for removing the polyimide film that blocks the opening does not have to be added to the entire steps.

After the development step is completed using this photolithography, the laminate section 30 is cured at 400 degrees Celsius in nitrogen (N2) gas. This curing increases the resistance strength of the polyimide film 28 (strength resistance), as a result, the reliability of a semiconductor device obtained after the subsequent steps will be improved.

Next, as an interlayer insulation film forming step, an interlayer insulation film is formed on the obtained laminate section 30.

Specifically, after an interlayer insulation film, for example, an NSG (Non-doped Silicate glass) film 32, is formed on the laminate section 30 using a CVD method, the NSG film 32 is polished and flattened so as to be made to remain with a thickness of 150 nm on the gate electrodes 22 using a CMP method (FIG. 2(A)).

When the NSG film 32 is formed using a CVD method, there is a danger of the polyimide film 28 being undesirably removed depending on a type of gas used. Therefore, before forming the NSG film 32, an SOG film (not shown) with a thickness of 100 nm is preferably formed on the laminate section 30 so that the polyimide film 28 can be protected and the strength resistance of the laminate section30 can be increased.

Then, resist patterns 34 for forming a contact hole is formed on this NSG film 32 in such a manner that the space between the patterns becomes wider than the distance between the gate electrodes 22 (refer to FIG. 2(B)). In the illustrated structural example, the distance between the resist patterns is made to be larger than the width a of the polyimide film 28.

As a contact hole opening step, the NSG film 32 located above the polyimide film 28 remaining between the gate electrodes 22 is removed in such a manner that the width of a hole of the NSG film 32 is larger than the distance between the gate electrodes 22 to open a contact hole 36.

Specifically, silicon nitride film 26 is used as an etching prevention film, and more particularly, etching is carried out under the condition that an etching selectivity ratio of the silicon nitride film 26 to the NSG film 32 is preferably approximately 3 times or more.

Then, by this etching process, the polyimide film 28 located between the adjacent gate electrodes 22 is made to be exposed to form the contact hole 36 (FIG. 2(C)). In this way, forming a part of the contact hole 36 lying on the gate electrodes 22 is also preferable in terms of increasing the level of integration for semiconductor devices.

Next, as a substrate exposure step, the polyimide film 28 and the silicon nitride film 26 remaining inside the contact hole 36 are removed to expose the semiconductor substrate 12 between the gate electrodes 22.

Specifically, first, in connection with removing the polyimide film 28 remaining between the gate electrodes 22 in the previous step, an ashing method and a reactive ion etching (RIE) method, etc. can be used in this embodiment.

In this embodiment, the polyimide film 28 is removed using an ashing method based on O2 (oxygen) (FIG. 3(A)).

The silicon nitride film 26 and the NSG film 32 cannot be damaged during this ashing process because sufficiently high etching selectivity ratio between the polyimide film 28, the silicon nitride film 26, and the NSG film 32 has been obtained. As a result, a superior contact hole 36 can be formed.

As mentioned above, it is also possible to remove the polyimide film 28 using the RIE method under the condition where an etching selectivity ratio of the polyimide film 28 and the silicon nitride film 26 to the NSG film 32 becomes sufficiently large. With the RIE method of anisotropic etching, there is no fear of etching inappropriate regions compared to the ashing method of isotropic etching, and just the polyimide film 28 can be controllably removed, therefore, which makes this method more appropriate.

Using the NSG film 32 as an etching mask, the silicon nitride film 26 remaining on the bottom of the contact hole 36 is removed using an arbitrary suitable etching under the condition where an etching selectivity ratio of the NSG film 32 to the silicon substrate 12 is high, so as to obtain a desired contact hole 36 (FIG. 3(B)).

After that, an arbitrary suitable plug material (tungsten (W), etc.) is embedded in the contact hole 36 to be used as a contact plug (not shown).

As is apparent from the above-mentioned description, the polyimide film 28 is provided between the gate electrodes 22 in this embodiment. As a result, the silicon nitride film 26 can avoid being undesirably etched due to lowering of an etching selectivity ratio of the silicon nitride film 26 to the NSG film 32 of an interlayer insulation film in the groove section of the gate electrodes 22 when etching for forming the contact hole 36.

Therefore, this polyimide film 28 prevents the silicon nitride film 26 from functioning as an etching prevention film and from allowing a part of the surface of the gate electrodes 22 to become exposed. This can prevent short-circuit failure, etc. caused by exposure of the gate electrodes 22.

In addition, as there is a concern that the silicon nitride film 26 is unnecessarily etched, the etching selectivity ratio of the silicon nitride film 26 to the NSG film 32 tends to be set significantly high in the related art. According to the present invention, this selectivity ratio does not have to be set significantly high.

As a result, for example, problems such as the stopping of etching caused by a reaction product generated during a dry etching process with a high aspect ratio can be solved, and the contact hole 36 can be formed at a relatively low cost.

Also, temporarily, instead of an organic insulation film material such as polyimide, polysilicon, etc. can be used, and a BPSG film and a PSG film can be used for an interlayer insulation film. However, impurity materials such as boron (B) and phosphorous (P) from the BPSG film, and phosphorous, etc. from the PSG film diffuse over polysilicon, and therefore the capacity between wires increases. However, by providing a configuration using an organic insulation film (polyimide film) and interlayer insulation film (NSG film) described above, there is no concern of generation of such undesirable impurity diffusion.

Therefore, even though the space between the adjacent gate electrodes 22 becomes narrower or the diameter of an opening of the contact hole 36 shrinks as the level of integration of semiconductor devices increases, contact holes can be formed easily and in accordance with designed values.

Second Embodiment

A method for manufacturing semiconductor devices of the second embodiment of the present invention will be described in the following based on FIGS. 4(A)–4(C).

The second embodiment differs with respect to carrying out the organic insulation film removing step by using mainly an ashing method or an RIE method.

In this embodiment, firstly, steps ranging from the gate electrode forming step to the organic insulation film forming step are carried out in the same manner as in the steps from the gate electrode forming step to the organic insulation film forming step of the first embodiment (refer to FIG. 1(B)).

An ashing method or an RIE method is used in this embodiment as the organic insulation film removing step.

Specifically, for example, in this embodiment, the polyimide film 28 above the gate electrodes 22 is removed using an ashing method based on O2 (oxygen) in such a manner that a section of the polyimide film 28 located between the gate electrodes 22 remains, as for the polyimide film 28 on the silicon substrate 12. As a result, the silicon nitride film 26 above the gate electrodes 22 is exposed, and a laminate section 31 as shown in FIG. 4(A) can be obtained.

The silicon nitride film 26 cannot be damaged during this ashing process because sufficiently high etching selectivity ratio of the polyimide film 28 to the silicon nitride film 26 has been obtained.

After the organic insulation film removing step, the laminate section 31 is cleaned by water-washing or scrub-washing to remove residual materials such as reaction products produced by the ashing method.

The polyimide film 28 is preferably made to remain between the adjacent gate electrode 22 to as great an extent as possible, and more preferably, is made to remain so as to sufficiently cover the groove section between gate electrodes 22. Further, as already described before, it is also possible to perform etching on the polyimide film 28 using the RIE method under the condition where an etching selectivity ratio of the polyimide film 28 to the silicon nitride film 26 becomes sufficiently large. By using the RIE method of anisotropic etching, just the desired polyimide film 28 can be removed in a controllable manner.

Next, in this embodiment, an interlayer insulation film forming step is carried out in the same manner as in the interlayer insulation film forming step of the first embodiment (FIG. 4(B)). A contact hole opening step is carried out in the same manner as in the contact hole opening step of the first embodiment (refer to FIG. 4(C)). Next, a substrate exposure step is carried out in the same manner as in the substrate exposure step of the first embodiment (FIG. 3(B)).

As is apparent from the above description, in this embodiment, the same effects can be obtained as in the first embodiment.

The present invention is not limited to only the combination of above-mentioned embodiments. Therefore, the present invention can be applied by combining suitable conditions at an arbitrary suitable stage.

What is claimed is:

1. A semiconductor device manufacturing method comprising:

forming a plurality of gate electrodes on a semiconductor substrate;

forming an etching prevention film over the surface of adjacent gate electrodes and on the semiconductor substrate between the adjacent gate electrodes;

forming an organic insulation film having heat-resistance on the etching prevention film;

removing the organic insulation film above the gate electrodes in such a manner that the organic insulation film remains between the gate electrodes;

forming an interlayer insulation film on a laminate section obtained by the organic insulation film removing step;

for forming a contact hole by removing the interlayer insulation film on the remaining organic insulation film with a width wider than the distance between the gate electrodes; and exposing the semiconductor substrate between the gate electrodes by removing the organic insulation film and the etching prevention film remaining inside the contact hole.

2. The semiconductor device manufacturing method of claim 1, wherein the organic insulation film contains polyimide resin.

3. The semiconductor device manufacturing method of claim 1, wherein the organic insulation film removing step includes an exposure step and a development step for the organic insulation film.

4. The semiconductor device manufacturing method of claim 1, wherein the organic insulation film removing step includes an ashing method for the organic insulation film.

5. The semiconductor device manufacturing method of claim 1, wherein the organic insulation film removing step includes an RIE technique for the organic insulation film.

* * * * *